(12) United States Patent
Colelli et al.

(10) Patent No.: US 6,342,735 B1
(45) Date of Patent: *Jan. 29, 2002

(54) DUAL USE ALIGNMENT AID

(75) Inventors: James J. Colelli, Jericho; Steven J. Holmes, Milton; Peter H. Mitchell, Jericho, all of VT (US); Joseph Mundenar, Eden Prairie, MN (US); Charles A. Whiting, Milton, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 136 days.

(21) Appl. No.: 09/388,315

(22) Filed: Sep. 1, 1999

(51) Int. Cl.$^7$ ............................................. H01L 23/544
(52) U.S. Cl. ...................................................... 257/797
(58) Field of Search ......................... 257/797; 438/401

(56) References Cited

U.S. PATENT DOCUMENTS

| | | | | |
|---|---|---|---|---|
| 4,233,091 A | | 11/1980 | Kawabe | 148/175 |
| 4,309,813 A | * | 1/1982 | Hull | 29/580 |
| 4,338,620 A | | 7/1982 | Kawabe | 357/50 |
| 5,498,501 A | | 3/1996 | Shimoda et al. | 430/22 |
| 5,532,520 A | | 7/1996 | Haraguchi et al. | 257/797 |
| 5,695,897 A | | 12/1997 | Mitome et al. | 430/22 |
| 5,982,044 A | * | 11/1999 | Lin et al. | 257/797 |
| 6,037,671 A | * | 3/2000 | Keplet et al. | 257/797 |
| 6,043,134 A | * | 3/2000 | Bishop | 438/401 |
| 6,049,137 A | * | 4/2000 | Jang et al. | 257/797 |
| 6,077,756 A | * | 6/2000 | Lin et al. | 438/401 |
| 6,081,040 A | * | 6/2000 | Okuda et al. | 257/797 |
| 6,083,807 A | * | 7/2000 | Hsu | 438/401 |
| 6,097,102 A | * | 8/2000 | Takizawa | 257/797 |

FOREIGN PATENT DOCUMENTS

| | | | | |
|---|---|---|---|---|
| GB | 1560778 | | 2/1980 | 356/401 |
| JP | 54-072684 | | 6/1979 | 356/401 |

OTHER PUBLICATIONS

Electron Beam/Optical Mixed Lithography at Half–Micron Ground Rules, P. Coane, P. Rudeck, L. K. Wang, F. Hohn, Microelectronic Engineering 5 (1986) 133–140, Elsevier Science Publishers B.V. (North–Holland).

* cited by examiner

Primary Examiner—Steven Loke
Assistant Examiner—Douglas W. Owens
(74) Attorney, Agent, or Firm—James M. Leas (57) ABSTRACT

An alignment mark includes aspects of alignment marks used for two or more photolithography systems. Because the new mark includes the features specified for each system it can be read by the detectors of both systems. Since each photolithography system is substantially insensitive to the presence of the aspect used by the other system precision alignment can be achieved by each system.

22 Claims, 10 Drawing Sheets

DUAL USE ALIGNMENT AID

FIELD OF THE INVENTION

This invention generally relates to alignment marks, such as alignment marks for photolithography. More particularly, it relates to alignment marks on masks or reticles, and on semiconductor wafers, for aligning the position of the wafer to the position of the mask or reticle.

BACKGROUND OF THE INVENTION

Semiconductor wafer fabrication involves building a structure in sequential steps including ion implantation, diffusion, deposition, contact formation, and metalization. Most of these steps require precise positioning of the wafer with the masks, and these masks must be almost perfectly aligned to the structure formed on the wafer by the previous steps. A particular mask is aligned to the wafer with an alignment system included in photolithography equipment that recognizes alignment marks printed on the wafer.

In most currently available commercial align and expose equipment, the mask to wafer alignment is accomplished automatically in several phases: a coarse alignment, an intermediate alignment, and a fine alignment. For each of these phases there may be separate alignment marks on the wafer and separate mark reading and alignment systems in the equipment. Generally, the coarse alignment of the mask and wafer are done without reference to each other. Fine alignment systems on previous generations of equipment depended on manual alignment. An operator located the alignment marks and adjusted the position of the wafer and mask or reticle. When the operator saw that the alignment error was small enough he or she would expose the wafer.

Current alignment systems perform the fine mask and wafer alignments automatically, without operator intervention. An automatic alignment system consists of an alignment mark on the wafer and on the mask, an alignment sensor or measurement system, an algorithm to interpret the alignment measurement data and to calculate misalignment, and a mechanical positioning system to correct the position of the mask and wafer and to hold them in alignment throughout the exposure.

There are presently several different types of aligment systems, including ones that use bright field, dark field, through the lens illumination, off-axis illumination, wide wavelength range, narrow wavelength range, or single wavelength, and staring or scanning.

The alignment algorithm software confirms that the correct mark has been selected, uses estimation or curve fitting to determine the location of marks and to minimize the effect of measurement error, combines all available data to determine a best estimate of position and alignment errors, calculates correction commands, and transmits those commands to the positioning system.

Alignment marks typically consist of narrow bars or gratings oriented to provide x and y positioning information. The alignment mark is printed in the kerf, the narrow space between chips on the wafer, at an early processing step and that mark is typically read at several subsequent masking steps so each of these subsequent masks is aligned to the same mark. The marks must be robust to survive wafer fabrication steps. They must also be of unique design so that there is no confusion with circuit patterns.

However, a problem arises because the marks are different for nearly each type of photolithography equipment. Different vendors all have different marks. And even for different equipment supplied by the same vendor the marks can be quite different. Thus, if a first level is printed with a first mark, only certain photolithography tools that can read that mark can be used on all subsequent levels. To overcome this problem, two or more alignment marks have been provided on each mask and printed in the kerf that are readable by different photolithography alignment tools so that subsequent levels could be exposed by different exposure equipment. However, these additional marks consume valuable kerf area. Thus, a better solution for alignment is required to provide a way for different equipment to read alignment marks without using up a large amount of kerf area, and solutions are provided by the following invention.

SUMMARY OF THE INVENTION

It is therefore an object of the present invention to provide an alignment mark that can be read by different alignment systems.

It is a further object of the present invention to provide an alignment mark that combines elements of alignment marks used for each alignment system.

It is a further object of the present invention to provide an alignment mark that is the combination of alignment marks used for different alignment systems.

It is a feature of one embodiment of the present invention that an alignment mark includes a portion of a first alignment mark for a first system and a portion of a second alignment mark for a second system.

It is an advantage of the present invention that a single alignment mark can be read by two or more different alignment systems.

It is an advantage of the present invention that kerf area is saved by combining alignment marks into a single alignment mark.

These and other objects, features, and advantages of the invention are accomplished by a structure comprising an alignment mark which has a first aspect and a second aspect different from the first aspect. A first photolithography tool is capable of aligning to the first aspect and a second photolithography tool is capable of aligning to the second aspect of the alignment mark. The first photolithography tool is substantially insensitive to the presence of the second aspect and the second photolithography tool is substantially insensitive to the presence of the first aspect.

A second way of describing the invention is a structure comprising an alignment mark which is capable of being read by a first photolithography tool and by a second photolithography tool. The mark comprises horizontal lines or vertical lines, and the first tool reads the mark with light reflected or diffracted from the horizontal or said vertical lines. The mark also comprises at least one diagonal line, and the second tool reads the mark with light reflected or diffracted from the at least one diagonal line.

BRIEF DESCRIPTION OF THE DRAWINGS

The foregoing and other objects, features, and advantages of the invention will be apparent from the following detailed description of the invention, as illustrated in the accompanying drawings, in which:

FIG. 4a is a top view of an alignment mark of the present invention that is a combination of portions of the alignment marks of FIG. 1 and FIG. 3a;

FIG. 4b is a magnification of the alignment mark FIG. 4a;

DETAILED DESCRIPTION OF THE INVENTION

Photolithographic tool vendors, including ASML, SVGL, Nikon, and Canon, have systems sensitive to unique alignment marks. In some cases a vendor may have different marks for each of their own different photolithography tools. The present inventors recognized that a single alignment mark can be generated that comprises a combination of an adequate part of the alignment mark used for two or more systems that can be read by the detectors of both systems to give precise alignment. The present inventors further recognized that the presence in the combined mark of aspects of the mark used by one tool does not substantially interfere with reading the mark by the other tool. Following is an example illustrating how portions of an ASML alignment mark and an SVGL alignment mark are superimposed to form a single mark that can be read by tools of both companies to give precise alignment.

Figure 1:
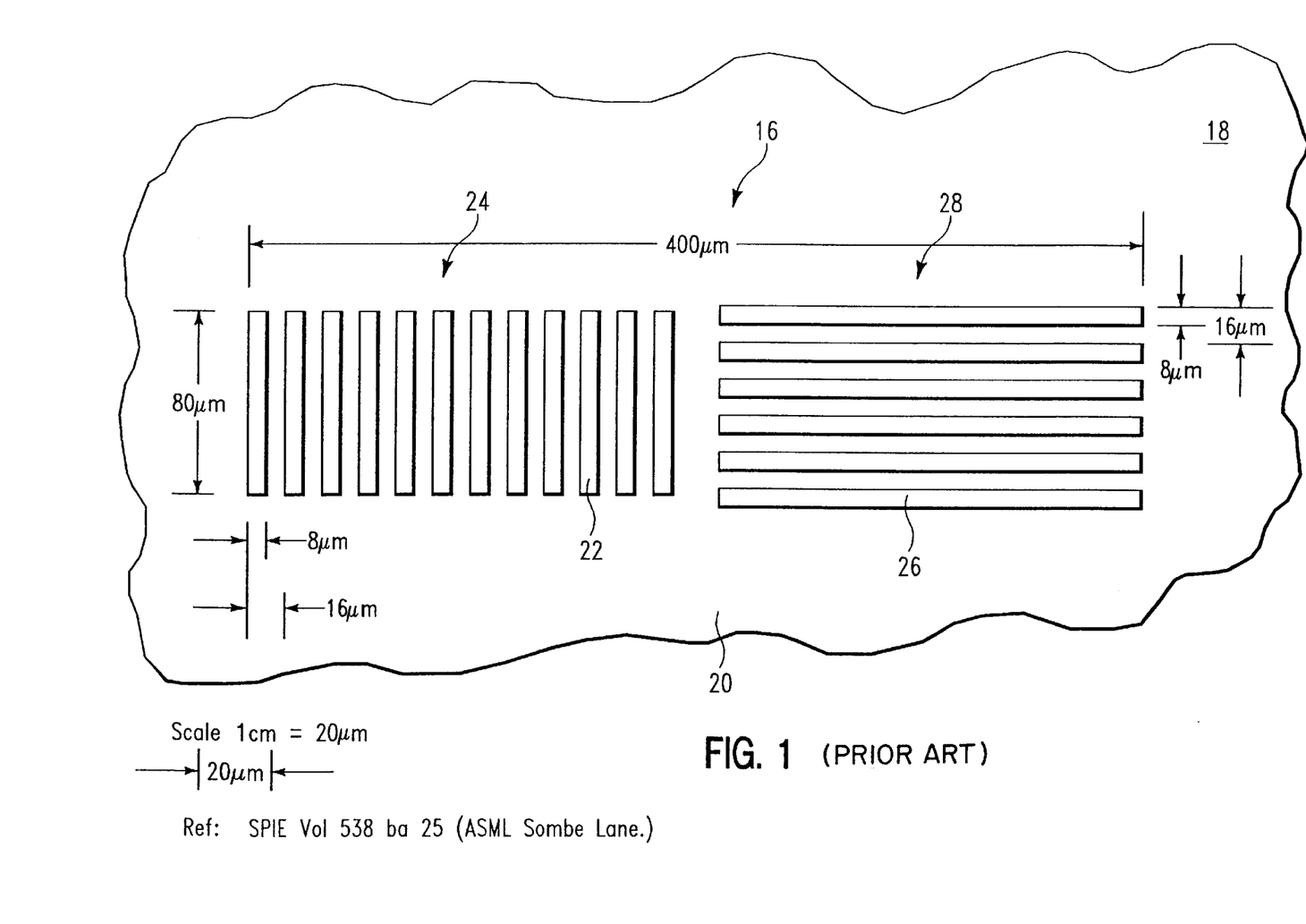
FIG. 1 is a top view of an ASML alignment mark.

One ASML alignment system reads the first mark in our example, ASML alignment mark 16 of FIG. 1 in kerf area 18 on wafer 20. Details of this alignment mark were published in SPIE Volume 538, Optical Microlithography IV, in 1985, on page 25. The ASML system reads the mark by detecting light diffracted from lines 22 of grating 24 for x alignment and lines 26 of grating 28 for y alignment. The entire mark has a dimension of 400 microns by 80 microns and the 8 micron wide lines 22, 26 of each grating are on a 16 micron pitch. Mark 16 is printed on wafer 20 at a first level of processing. Alignment mark 16 on wafer 20 is then used in conjunction with a mark (not shown) on a mask being aligned to that level.

Figure 2:
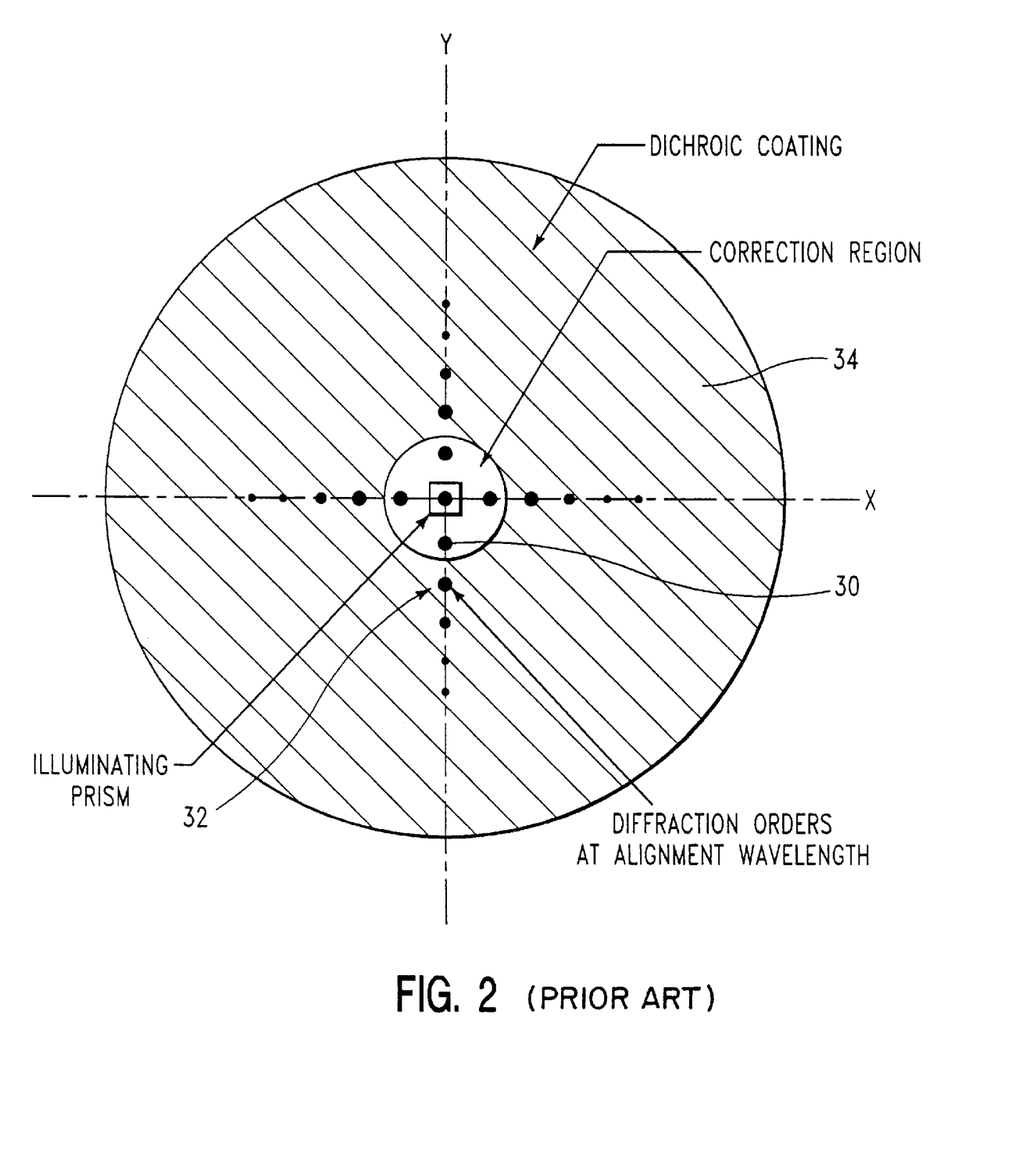
FIG. 2 is a top view of the diffraction pattern resulting from light reflected from the gratings of FIG. 1.

Only first orders 30 of the diffraction pattern 32 resulting from light reflected from each grating 24, 28 in the plus and minus directions are collected through spatial filter 34 of a mark alignment system, as shown in FIG. 2. These first order diffraction orders 30 are then passed through a transmission grating on the mask (not shown) used for the next level of processing. Interference signals emerging from the mask are analyzed to detect misalignment of the wafer with the mask and to provide correction.

Figure 3A:
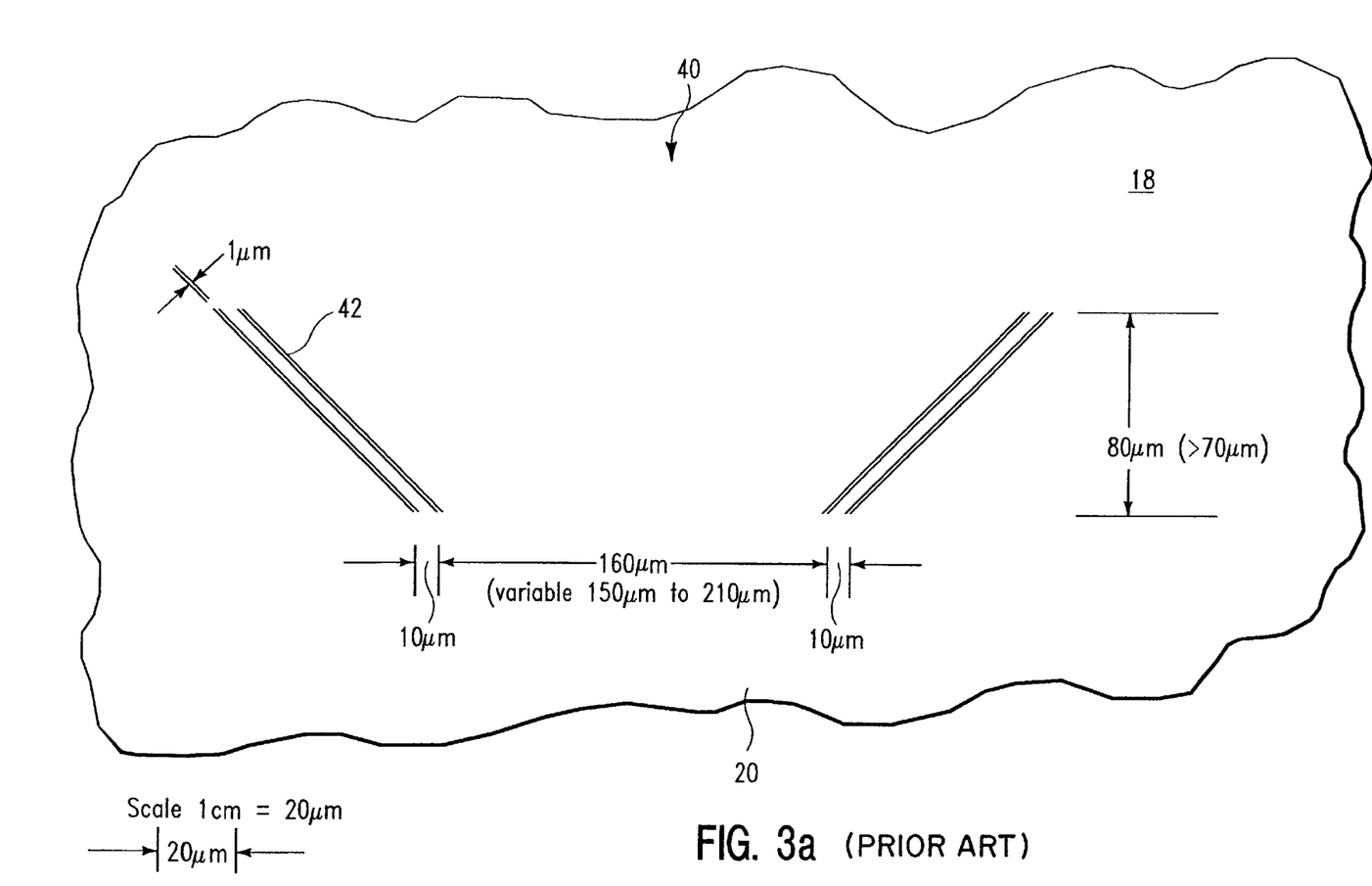
FIG. 3a is a top view of an SVGL alignment mark.
Figure 3B:
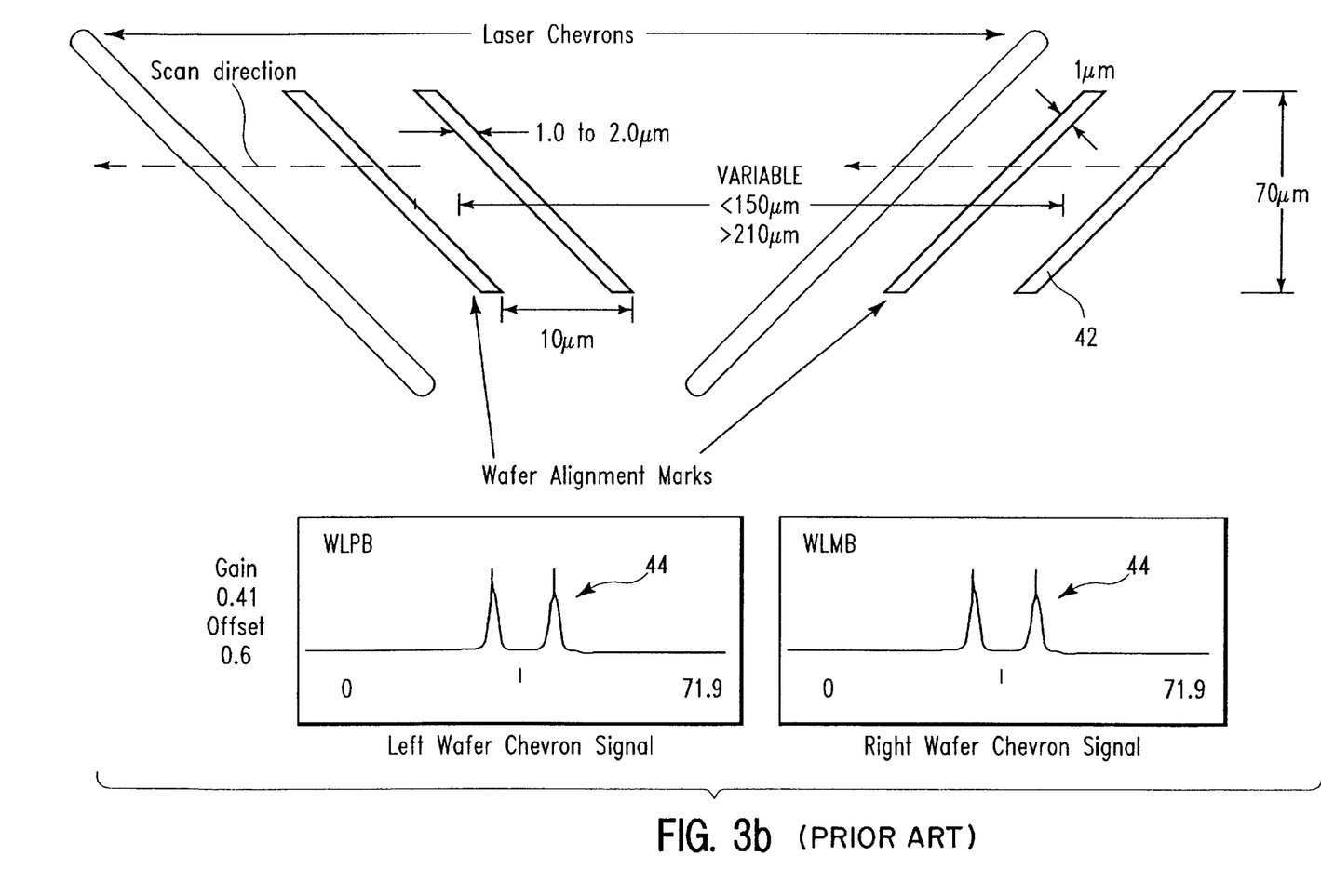
FIG. 3b is an enlarged view of the mark of FIG. 3a, shown the direction of scanning, and shows the optical signal.

One SVGL alignment system reads the second mark in our example, SVGL alignment mark 40 of FIG. 3a, by detecting the amplitude of light reflected or diffracted from diagonal bars 42 of mark 40 located in kerf 18 of wafer 20 during a scanning step. The SVGL mark alignment system correlates the optical signal 44, shown in FIG. 3b, with the derivative of that signal to eliminate noise and to accurately determine the position of the mark on the wafer. In a completely separate step, a similar diagonal mark on the mask used for the next level of processing is similarly analyzed and a signal processing correlation algorithm is used to calculate a correction for the position of the mask.

As shown in FIG. 3a, 45 degree angle lines 42 of SVGL alignment mark 40 are each 1 micron wide and pairs of these lines are spaced 10 microns apart as measured in the horizontal direction. Oppositely oriented diagonal pairs are spaced 160 microns apart and the lines are 70 to 80 microns high as measured in the vertical direction.

Figure 4A:
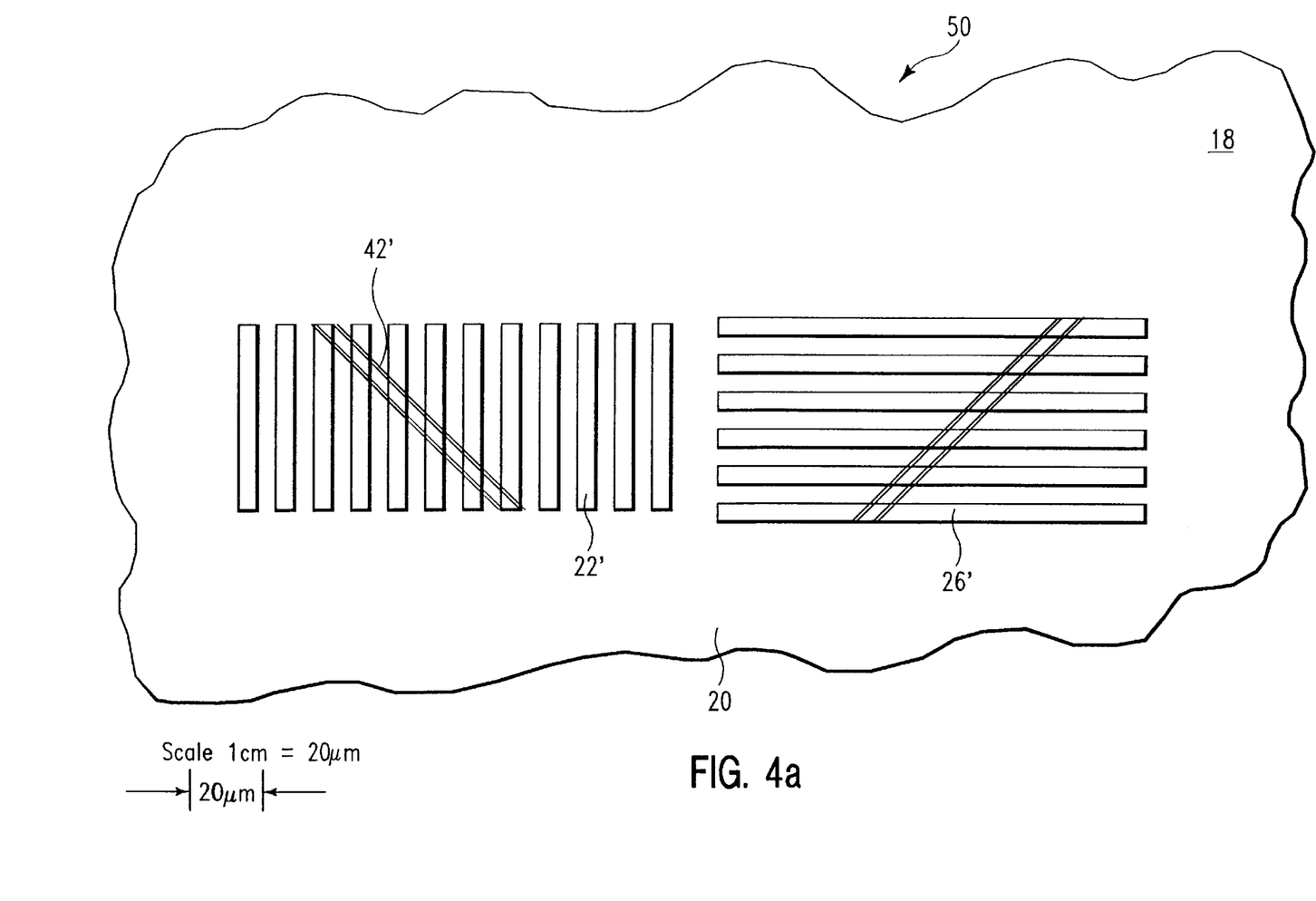

The present inventors have determined that mark 50, shown in FIG. 4a, formed by superimposing aspects of ASML mark 16 with SVGL mark 40, can be used to align wafer 20 to a mask in both the ASML and the SVGL systems. The inventors determined that signal from the portion of mark 50 from one mark negligibly affects detection by the system used to detect the other mark since detectors are highly tuned to the unique pitch, spacing, and angle of their respective marks.

Figure 4B:
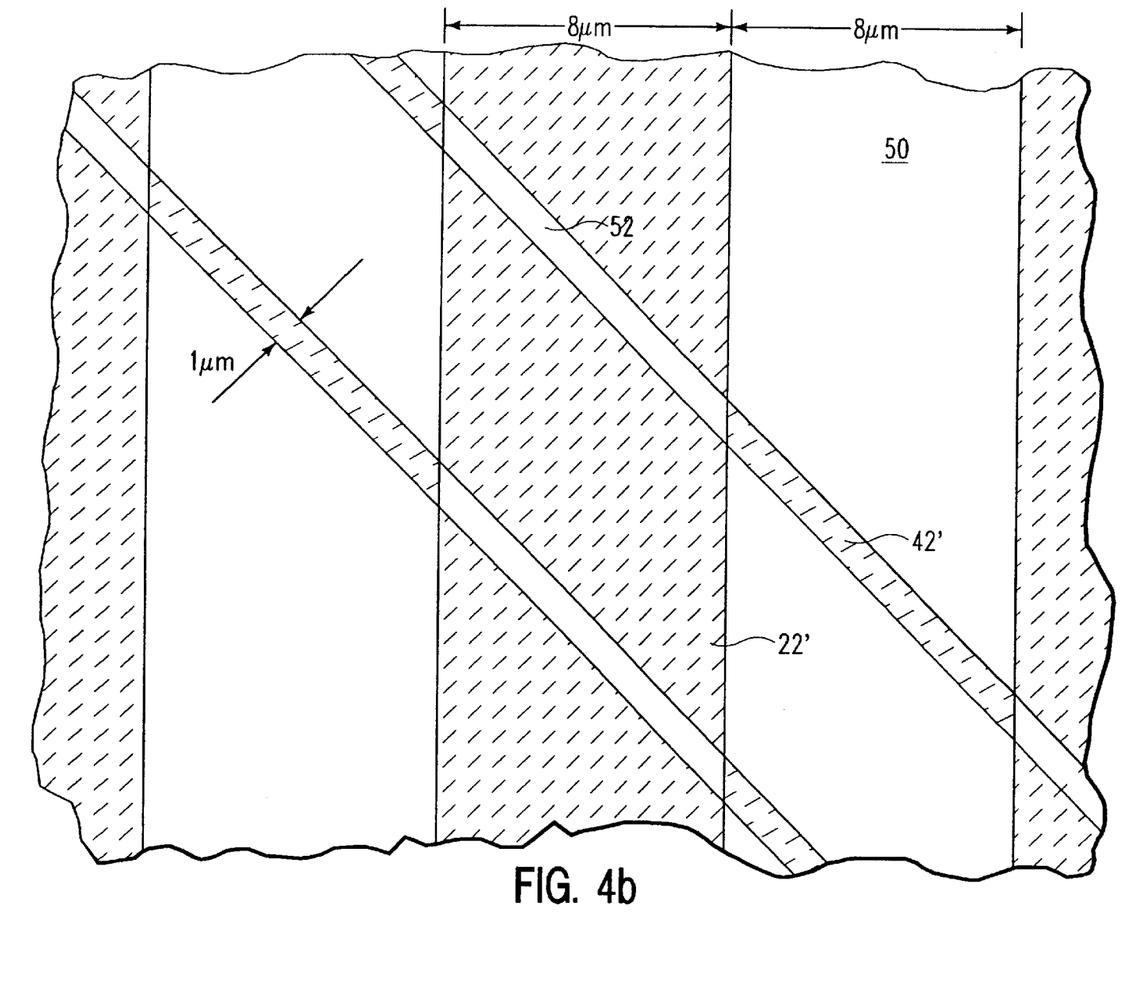
Figure 4C:
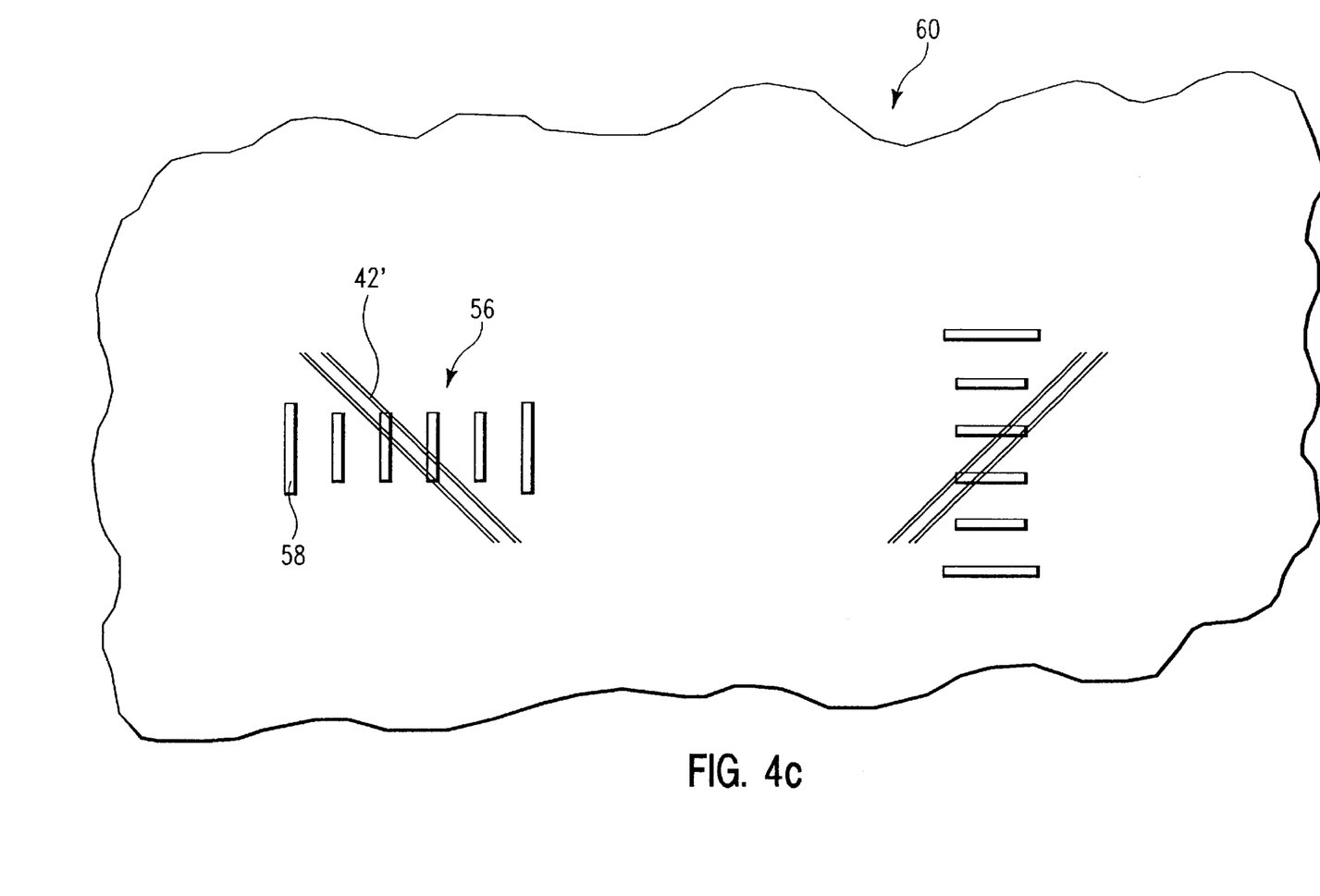
FIG. 4c is a top view of an alignment mark similar to the alignment mark of FIG. 4a wherein the grating has larger end lines than center lines.

A more detailed view of the intersection of mark 16 and mark 40 in FIG. 4b shows clear areas 52 in regions of diagonal bars 42' on the mask used to generate alignment mark 50 where diagonal SVGL mark 42' crosses line 22' on the ASML aspect of mark 50. Providing clear areas 52 enhances signal to the SVGL detector since the entire edge of each diagonal line 42' remains available for detection. This same idea of superimposing portions of marks holds with a wide range of alignment marks, including marks with modified individual lines, such as Canon mark 56 that has longer outside grating lines 58 shown as part of combined mark 60 of FIG. 4c. This mark can be read by both Canon and SVGL systems.

Where two different alignment techniques are used for alignment, such as diagonal lines for one system and a vertical or horizontal grating for the second system, then the combined alignment mark is not restrained by the size of lines or the spacing between lines, as demonstrated in FIG. 4a. The polarity of lines where they intersect can be adjusted to improve signal to noise ratio for each detector, however, as shown in FIG. 4b. The mark illustrated in FIG. 4a includes dimensions specified by SVGL and ASML for their marks. However, a similar mark will also serve in the Canon grating align system, and in the Nikon FIA and LIA systems, and dimensions can be adjusted, if needed.

Where a single grating is being designed to serve as an alignment mark for more than one tool, a combination of marks is simplified if a line width and pitch for the combined grating is available that can be read by each detector to optimize signal for each detector. A single grating can thereby be read by two or more tools without degradation in the alignment results.

Figure 5:
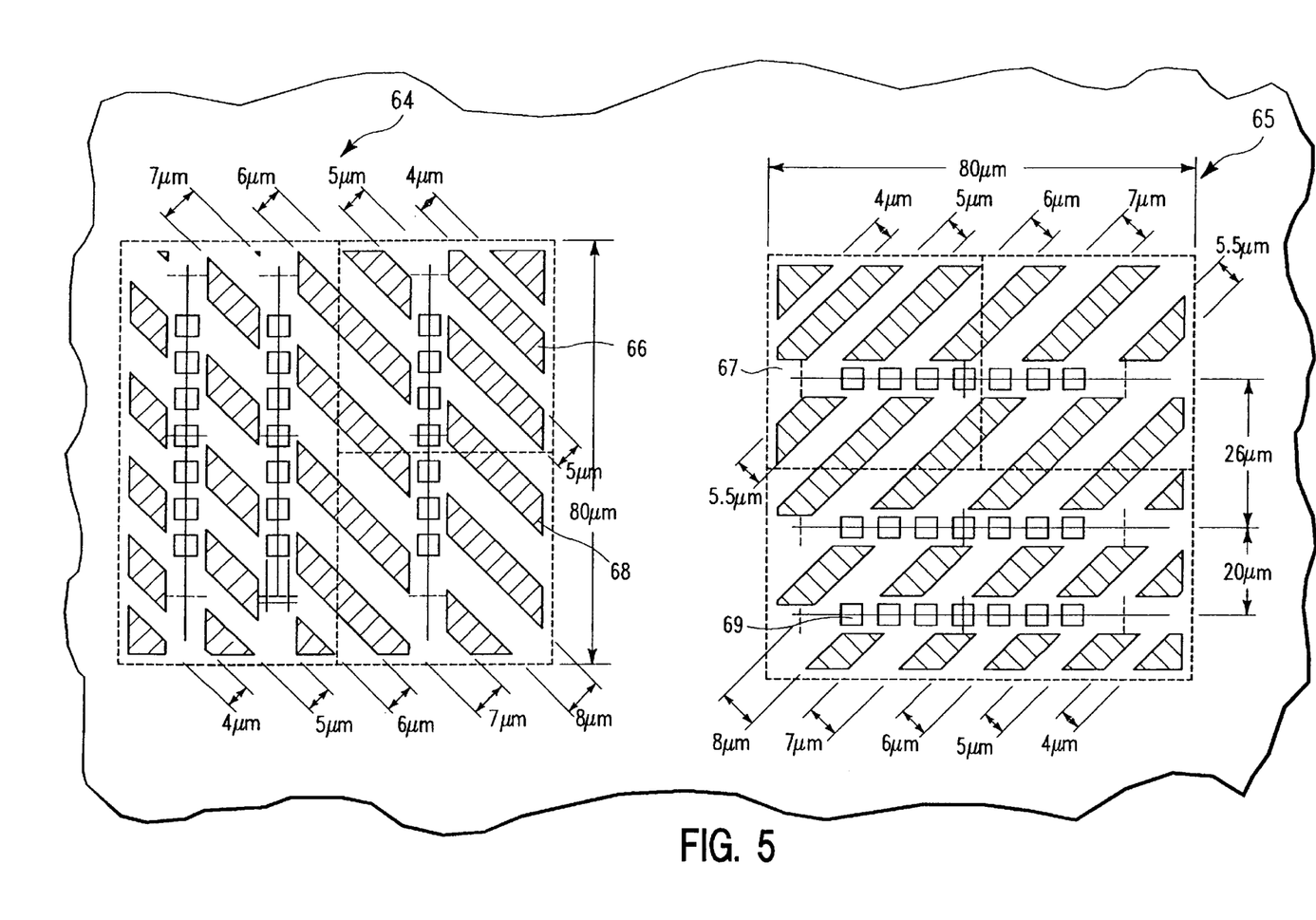
FIG. 5 is a top view of an alignment mark of the present invention that is readable by SVGL and by Nikon photolithographic equipment using LSA mode.
Figure 6:
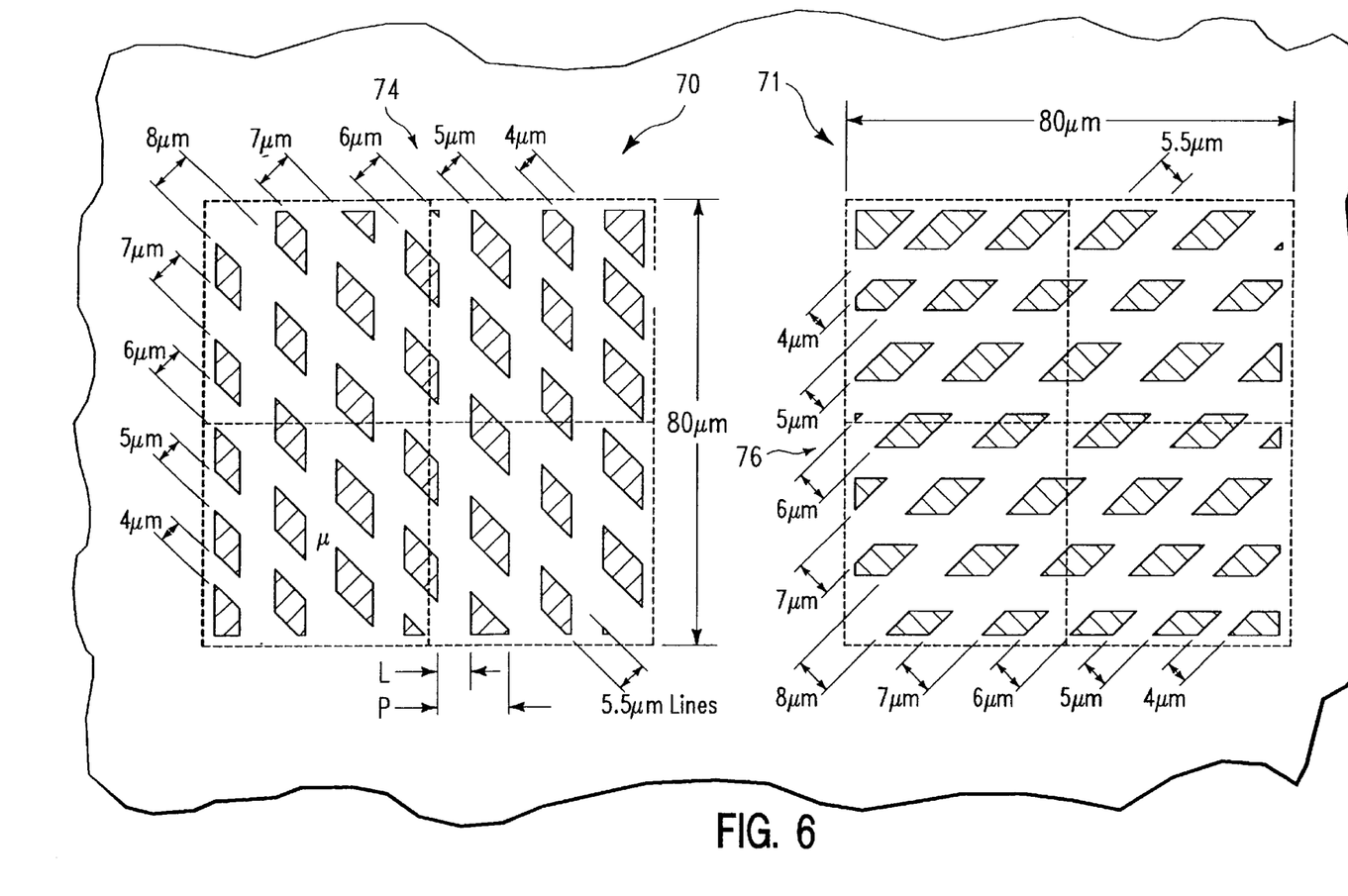
FIG. 6 is a top view of an alignment mark of the present invention that is readable by the SVGL, the Nikon FIA and LIA, the Canon, and the ASML alignment systems.
Figure 7:
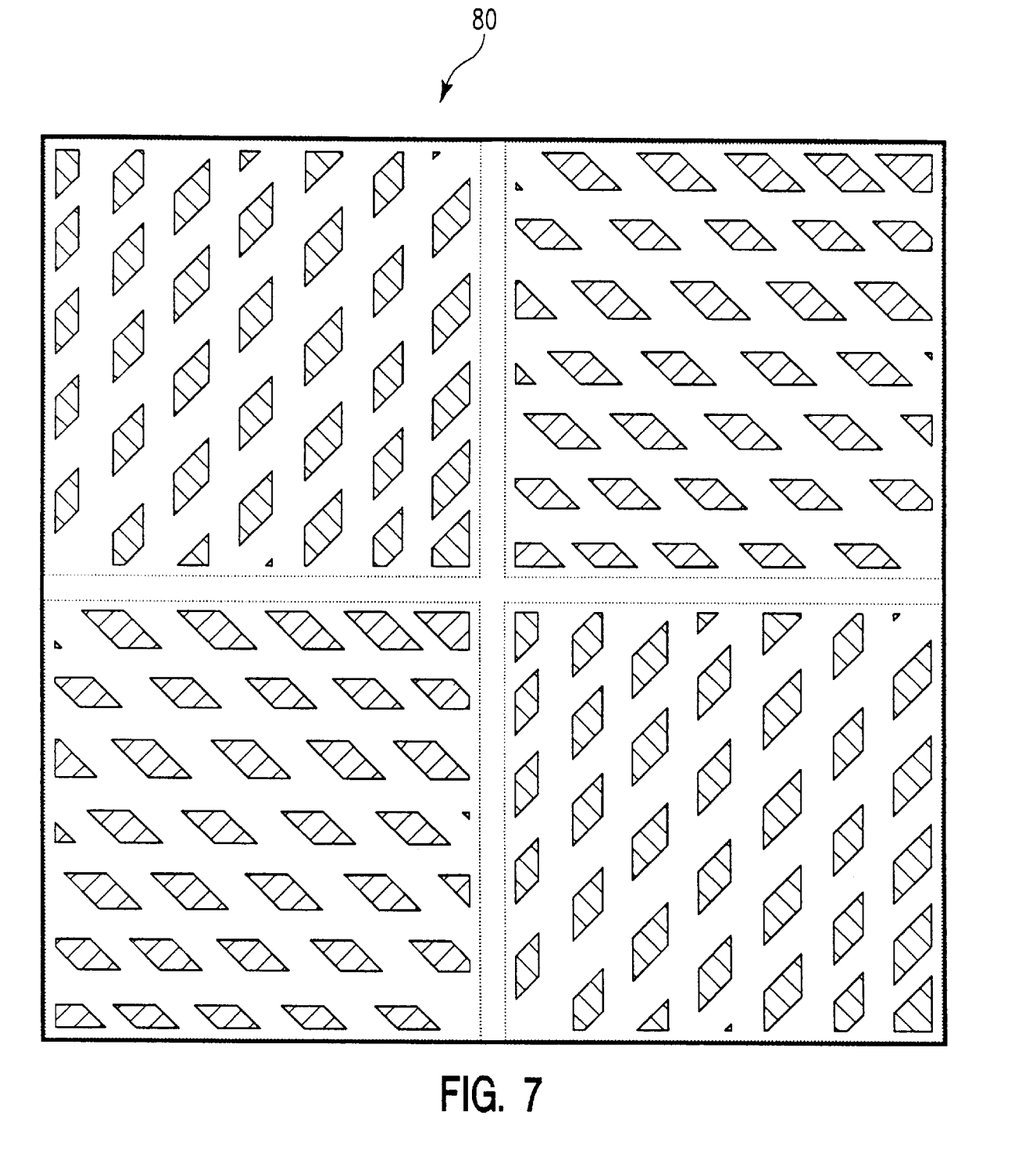
FIG. 7 is a top view of a four-quadrant alignment mark of the present invention that is readable by the SVGL, the Nikon FIA and LIA, the Canon, and the ASML alignment systems.

Additional examples of marks generated from a combination of standard marks are illustrated in FIGS. 5–7. Combined mark 64, 65, which is a combination of variably spaced diagonal stripe grating mark 66, 67 used in the SVGL variable box system, with linear grating mark 68, 69 used in a Nikon LSA system, is shown in FIG. 5. The continuous diagonal lines of the SVGL system are interrupted or segmented to provide for the Nikon mark. The Nikon mark is also altered by the nearby presence of the SVGL stripes. Neither of these modifications is expected to prevent precise alignment when the combined mark is read by either system since each photolithography tool is substantially insensitive to the presence in the mark of the aspect needed by the other tool.

FIG. 6 shows combined mark 70, 71 which is a segmented combination of a variably spaced diagonal stripe mark used in a SVGL variable box system with a vertical and horizontal stripe mark used in Nikon FIA and LIA alignment systems and in Canon and ASML alignment systems. The line width, L, and pitch, P, selected for combined vertical and horizontal segmented lines 74, 76 in combined mark 70, 71 is best if they satisfy the requirements of all four systems that read vertical and horizontal lines. The inventors have found that the ASML requires a line width of either 8or 8.8 microns. They have found that these line widths also work on the two Nikon systems and expect that this line width will work on the Canon system. They have also found that the ASML requires a pitch of 16 to 17.6 microns and that the Nikon and Canon systems will work in this range. Thus, the combined segmented mark illustrated in FIG. 6 can satisfy the requirements of all four systems reading vertical and horizontal gratings as well as the system reading the diagonal stripe variable box system. Segmenting the lines increases the signal available to each system.

Combined mark 80, similar to mark 70, 71 of FIG. 6 but with two additional orientations, is illustrated in FIG. 7, which shows a four-quadrant structure. Mark 80 is a 500 micron by 500 micron sized mark designed to be used as an ASML zero level mark, as distinguished from smaller marks designed to be used exclusively in the kerf. Portions of combined mark 80 can also be used by Canon, Nikon FIA and LIA, and by SVGL systems.

Preferably the combination of marks of two or more photolithography tools is accomplished on a single mask so that either tool can later be used to expose a subsequent mask level. This flexibility in exposure tool can lower the cost of production in addition to the savings achieved from avoiding larger kerfs for alignment marks. The combination can also be accomplished by a double exposure of two separate masks or by providing one mark on a first level and a second mark directly over the first mark on a second level.

In addition to providing an alignment mark that can be read by two tools, the present inventors recognized that stacking alignment marks that have different orientations as described above permits a mark on a higher level to be read by a tool that is insensitive to signal that may be reflected or diffracted from a mark having a different orientation that was printed on the lower level. Thus, they recognized that alignment marks can be stacked without the need for solid blocking pads between them. Yet a third alignment mark, similar to the first mark can then be stacked and distinguished as well since the second alignment mark blocks light from reaching the first mark and reflected or diffracted from that mark. Thus, a tool reading said third mark does not receive a substantial amount of interfering signal from said first mark. This is particularly advantageous with copper metalization on a semiconductor wafer; the large blocking pads presently used with aluminum metalization are not allowed in copper since they would be damaged in chemical-mechanical polishing steps.

While several embodiments of the invention, together with modifications thereof, have been described in detail herein and illustrated in the accompanying drawings, it will be evident that various further modifications in the design of the combined mark are possible without departing from the scope of the invention. Nothing in the above specification is intended to limit the invention more narrowly than the appended claims. The examples given are intended only to be illustrative rather than exclusive.

What is claimed is:

1. A structure, comprising an alignment mark, the alignment mark having a first aspect and a second aspect different from said first aspect, said first aspect comprising a first feature extending in a first direction and a second feature extending in a second direction, said second aspect comprising a third feature extending in a third direction and a fourth feature extending in a fourth direction, wherein each said direction is different from each said other directions, wherein said third feature is superimposed on said first feature and said fourth feature is superimpiosed on said second feature wherein a first photolithography tool is capable of aligning to said first aspect and a second photolithography tool is capable of aligning to said second aspect, wherein said first photolithography tool is substantially insensitive to the presence of said second aspect and said second photolithography tool is substantially insensitive to the presence of said first aspect.

2. A structure as recited in claim 1, wherein said first aspect comprises a portion of a first photolithography tool alignment mark and wherein said second aspect comprises a portion of a second photolithography tool alignment mark.

3. A structure as recited in claim 2, wherein said alignment mark is a combination of said first photolithography tool and said second photolithography tool alignment marks.

4. A structure as recited in claim 3, wherein said aliment mark includes a vertical or a horizontal grating and two differently angled features.

5. A structure as recited in claim 4, wherein said first photolithography tool reads said alignment mark with light reflected or diffracted from said vertical or said horizontal grating and wherein said second tool reads said mark with light reflected or diffracted from said angled features.

6. A structure as recited in claim 4, wherein lines of said horizontal or vertical grating are segmented into line segments.

7. A structure as recited in claim 6, wherein said two differently angled features are a grating of segmented angled lines, and wherein said grating of segmented angled lines are superimposed on said segmented vertical or horizontal lines.

8. A structure as recited in claim 4, wherein said two differently angled features are segmented into angled line segments.

9. A structure as recited in claim 4, wherein said alignment mark is read by either light reflected or diffracted from said angled features or by light reflected or diffracted from said vertical or said horizontal grating.

10. A structure as recited in claim 8, wherein said two differently angled features are at a 45 degree angle to vertical or said horizontal lines of said vertical or said horizontal grating.

11. A structure as recited in claim 1, wherein the structure comprises a semiconductor wafer, a semiconductor package, a mask, or a reticle.

12. A structure as recited in claim 1, wherein said mark is for aligning a mask to a semiconductor wafer.

13. A structure comprising an alignment mark, said alignment mark capable of being read by a first photolithography tool and by a second photolithography tool, wherein said alignment mark comprises horizontal features and vertical features and wherein said first tool reads said alignment mark with light reflected or diffracted from said horizontal and said vertical features, further wherein said alignment mark comprises a first diagonal feature extending in a first direction and a second diagonal feature extending in a second direction different from said first direction, wherein said first diagonal feature is superimposed on said horizontal features and said second diagonal feature is superimposed on said vertical features and wherein said second tool reads said alignment mark with light reflected or diffracted from said first and said second diagonal features.

14. A structure as recited in claim 13, wherein some of said horizontal features or said vertical features are segmented into line segments.

15. A structure as recited in claim 14, wherein said at least one diagonal feature is a grating of segmented diagonal lines, and wherein said grating of segmented diagonal lines is superimposed on said segmented vertical or horizontal lines.

16. A structure as recited in claim 13, wherein said diagonal feature is segmented into diagonal line segments.

17. A structure as recited in claim 13, wherein said diagonal feature is at a 45 degree angle to said horizontal or vertical lines.

18. A structure as recited in claim 13, wherein the structure comprises a semiconductor wafer, a semiconductor package, a mask, or a reticle.

19. A structure as recited in claim 13, wherein said alignment mark is for aligning a mask to a semiconductor wafer.

20. A semiconductor structure, comprising a first alignment mark on a first level and a second alignment mark on a second level, said second alignment mark directly above said first alignment mark, wherein said second alignment mark has a different orientation than said first alignment mark so that a tool reading said second alignment mark is insensitive to signal from said first alignment mark.

21. A structure as recited in claim 20, further comprising a third alignment mark on a third level, said third alignment mark directly above said first alignment mark, wherein said third alignment mark has the same orientation as said first alignment mark, and further wherein said second alignment mark blocks light so that a tool reading said third alignment mark does not receive a substantial amount of interfering signal from said first alignment mark.

22. A structure as recited in claim 20, wherein said alignment mark comprises copper.

* * * * *